(12) United States Patent
Hamano

(10) Patent No.: US 7,973,601 B2
(45) Date of Patent: Jul. 5, 2011

(54) DISTORTION COMPENSATION APPARATUS

(75) Inventor: Mitsuharu Hamano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/780,230

(22) Filed: May 14, 2010

(65) Prior Publication Data
US 2010/0295611 A1 Nov. 25, 2010

(30) Foreign Application Priority Data

May 21, 2009 (JP) ................................. 2009-122678

(51) Int. Cl.
*H03F 1/26* (2006.01)
(52) U.S. Cl. ........................................ 330/149; 375/297
(58) Field of Classification Search .................. 330/149, 330/151; 375/297
See application file for complete search history.

(56) References Cited

U.S. PATENT DOCUMENTS

| 5,905,760 | A  | * | 5/1999  | Schnabl et al. | ............... | 375/296 |
| 6,771,708 | B1 |   | 8/2004  | Suga et al.    |                |         |
| 7,180,368 | B2 | * | 2/2007  | Hirose et al.  | .................. | 330/149 |
| 7,551,687 | B2 | * | 6/2009  | Ode et al.     | ....................... | 375/296 |
| 7,848,452 | B2 | * | 12/2010 | Hayashi et al. | ............... | 375/297 |
| 2004/0212428 | A1 |  | 10/2004 | Ode et al.   |                |         |

FOREIGN PATENT DOCUMENTS

| JP | 5-79899      | 3/1993  |
| JP | 2008-199200  | 8/2008  |
| WO | 02/087097    | 10/2002 |
| WO | 2009/011071  | 1/2009  |

OTHER PUBLICATIONS

European Search Report dated Sep. 9, 2010, from the corresponding European Application.

* cited by examiner

*Primary Examiner* — Henry K Choe
(74) *Attorney, Agent, or Firm* — Katten Muchin Rosenman LLP

(57) ABSTRACT

An apparatus for compensating a distortion characteristic of an amplifier includes an update unit configured to store a distortion compensation coefficient, configured to calculate the coefficient based on a signal before input to the amplifier and a feedback signal, and configured to update the stored coefficient to the calculated coefficient; a distortion compensation unit configured to perform distortion compensation processing of the signal before input to the amplifier by using the updated coefficient; a delay unit configured to delay the signal before input to the amplifier by a set delay time, to output the delayed signal to the distortion compensation coefficient update unit; and a delay controller configured to control the set delay time based on a phase of a complex number having a power component of the signal before input to the amplifier as a real part, and a power component of the feedback signal as an imaginary part.

6 Claims, 7 Drawing Sheets

FIG. 1A REFERENCE SIGNAL

FIG. 1B FB SIGNAL

FIG.6

| STEP | φ MEDIAN VALUE | φ UPPER-LIMIT THRESHOLD | TAN φ | ERROR |
|---|---|---|---|---|
| 0 | 0.00000 | 0.02454 | 0.00000 | 0.0% |
| 1 | 0.04909 | 0.07363 | 0.04913 | 0.1% |
| 2 | 0.09817 | 0.12272 | 0.09849 | 0.3% |
| 3 | 0.14726 | 0.17181 | 0.14834 | 0.7% |
| 4 | 0.19635 | 0.22089 | 0.19891 | 1.3% |
| 5 | 0.24544 | 0.26998 | 0.25049 | 2.1% |
| 6 | 0.29452 | 0.31907 | 0.30335 | 3.0% |
| 7 | 0.34361 | 0.36816 | 0.35781 | 4.1% |
| 8 | 0.39270 | 0.41724 | 0.41421 | 5.5% |
| 9 | 0.44179 | 0.46633 | 0.47296 | 7.1% |
| 10 | 0.49087 | 0.51542 | 0.53451 | 8.9% |
| 11 | 0.53996 | 0.56450 | 0.59938 | 11.0% |
| 12 | 0.58905 | 0.61359 | 0.66818 | 13.4% |
| 13 | 0.63814 | 0.66268 | 0.74165 | 16.2% |
| 14 | 0.68722 | 0.71177 | 0.82068 | 19.4% |
| 15 | 0.73631 | 0.76085 | 0.90635 | 23.1% |

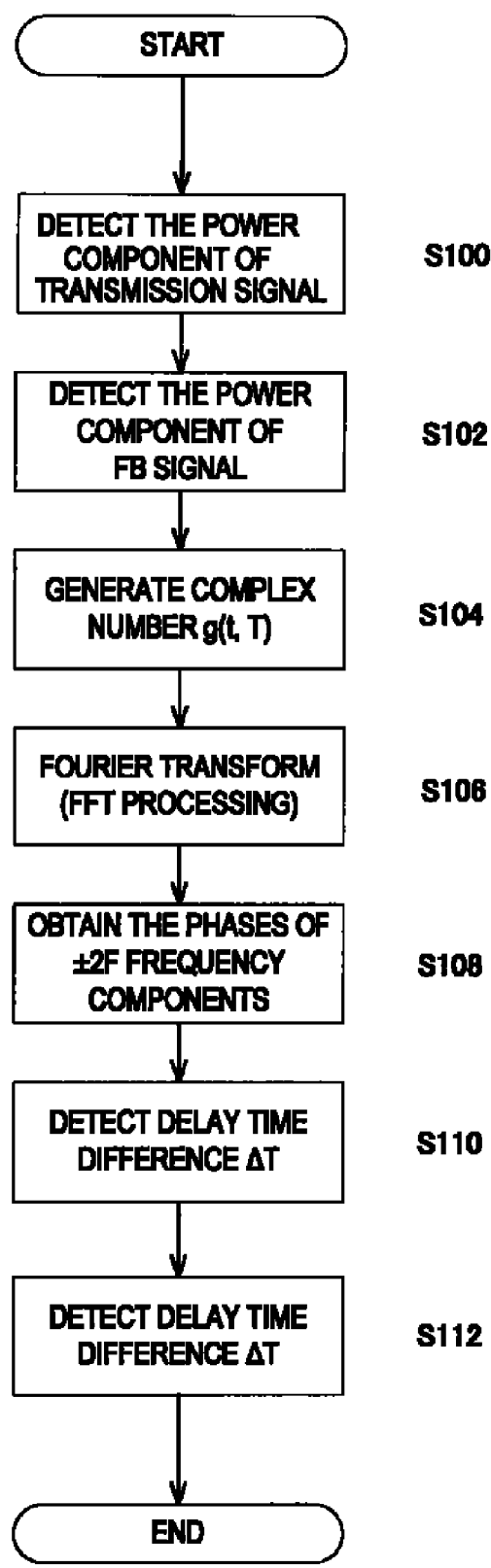

DISTORTION COMPENSATION APPARATUS

CROSS-REFERENCE TO RELATED APPLICATION

This application is based upon and claims the benefit of priority of the prior Japanese Patent Application No. 2009-122678, filed on May 21, 2009, the entire contents of which are incorporated herein by reference.

FIELD

The present invention relates to a distortion compensation apparatus for processing distortion compensation to the distortion characteristic of a power amplifier for amplifying signals.

BACKGROUND

In a low noise amplifier for use in a power amplifier for amplifying linearly modulated signals or a receiver for linearly modulated signals, high linearity is required to suppress the deterioration of a spectrum characteristic and a transmission characteristic caused by a signal distortion.

In particular, when a multilevel amplitude modulation system is applied to radio communication, by linearizing the amplitude characteristic of the power amplifier, a technique is required to suppress nonlinear distortion and reduce adjacent channel leakage power. Also, in general, although high power efficiency is always required for the amplifier, the linearity and the efficiency of the amplifier are generally contradictory characteristics, and when the improvement of power efficiency is intended using an amplifier having degraded linearity, a technique for compensating distortion produced thereby is inevitably needed.

As one of such the distortion compensation methods, a predistortion system is known. The principle of the predistortion system is to obtain a desired signal without distortion in the output of an amplifier by adding in advance an inverse characteristic of the distortion characteristic of the amplifier to an amplifier input signal.

Typically, in distortion compensation processing according to the predistortion system, a transmission signal before distortion compensation (reference signal) is compared with a feedback signal output from a power amplifier, and by use of the error thereof (power difference), a distortion compensation coefficient is calculated and updated. The distortion compensation coefficient is stored in a memory, of which address is determined from amplitude or power of the reference signal or the function thereof. Then, by multiplying the updated distortion compensation coefficient by a reference signal for subsequent transmission, an adjustment is made such that a reference signal gain comes to have an inverse characteristic of the distortion characteristic of the power amplifier. Then, the above gain-adjusted transmission signal is input to the power amplifier. By the repetition of the above operations, a convergence is made finally to an optimal distortion compensation coefficient, and thus, the distortion of the power amplifier is compensated.

In the above distortion compensation processing, through the measurement of the delay time in the feedback signal, it is possible to obtain an accurate distortion compensation coefficient by making a transmission signal time coincide with the feedback signal time.

The delay time in the feedback signal includes a delay in the power amplifier and a delay in an analog circuit on a feedback signal path. The above delay time is varied by various factors such as an external temperature and a secular change.

As a first method for adjusting the delay time variation in the above feedback signal, there is known a method for adjusting the delay by performing fast Fourier transform (FFT) on the feedback signal and by using the above FFT calculation result (Patent document 1). More specifically, using the FFT calculation result, the distortion compensation apparatus calculates one of the values of a signal-to-noise ratio, an adjacent channel leakage power ratio, and a noise level. By the comparison of the calculated value of the present time with the calculated value of one time before, the feedback signal delay is adjusted.

Also, as a second method, by the extraction of a certain range of time series of reference signals before distortion compensation and feedback signals, self-correlation values of both signals are obtained while each time of the above signals is relatively varied. Then, a time difference forming a maximum self-correlation value is determined to be a feedback signal delay time.

However, according to the above first method, there is applied feedback control to adjust the delay time to make the difference in the calculated values zero, instead of quantitatively obtaining the exact feedback signal delay time. Therefore, it takes a substantial time before an optimal delay time is obtained.

Also, according to the above second method, because the self-correlation property of the reference signals is relatively weak, and a definite peak value is not obtainable in the vicinity of the maximum value of the self-correlation values. This produces an error in the maximum value of the self-correlation values, and an accurate delay time is not obtainable. To cope with the above problem, the self-correlation calculations are executed for a plurality of number of times, so that the self-correlation values are accumulated. Thus, processing to eliminate the error from the self-correlation value to the possible extent is performed. However, this brings about the problem of producing an increased processing time and a low tracking speed.

[Patent document 1] International Publication No. WO 2002/087097.

SUMMARY

According to an aspect of the invention, a distortion compensation apparatus which compensates a distortion characteristic of an amplifier amplifying signals, includes: a distortion compensation coefficient update unit configured to store a distortion compensation coefficient to compensate the distortion characteristic of the amplifier, configured to calculate the distortion compensation coefficient to compensate the distortion character of the amplifier based on a signal before input to the amplifier and a feedback signal of a signal output from the amplifier, and configured to update the stored distortion compensation coefficient to the calculated distortion compensation coefficient; a distortion compensation unit configured to perform distortion compensation processing of the signal before input to the amplifier by using the updated distortion compensation coefficient; a delay unit into which the signal before input to the amplifier is input, configured to delay the signal by a set delay time, to output the delayed signal to the distortion compensation coefficient update unit; and a delay controller configured to control the set delay time to be set in the delay unit based on a phase of a complex number having a power component of the signal before input to the amplifier as a real part, and a power component of the feedback signal as an imaginary part.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 1A-1C are diagrams illustrating a complex number g(t, T).

FIG. 6 is a diagram illustrating an error of the phase φ when the approximation of φ≈tan φ is made.

FIG. 8 is a processing flowchart of delay control unit 30.

DESCRIPTION OF EMBODIMENTS

Embodiments of the present invention will now be described. It is to be noted however that the technical scope of the present invention is not limited to the embodiments.

First, a description will be given to the principle of delay time detection processing in a distortion compensation apparatus according to the present embodiment. There is obtained a complex number g(t, T) having, as a real part, the power component of a transmission signal (reference signal) Rf(t) before distortion compensation, and as an imaginary part, the power component of a feedback signal Fb(t+T) at the time of a delay time T. The complex number g(t, T) is expressed by formula (1). The power component of the reference signal Rf(t) is obtained by multiplexing the reference signal Rf(t) by the complex conjugate thereof. Also, the power component of the feedback signal Fb(t+T) is obtained by multiplying the feedback signal Fb(t+T) by the complex conjugate thereof.

$$g(t,T)=Rf(t)\overline{Rf}(t)+jFb(t+T)\overline{Fb}(t+T) \quad (1)$$

Figure 1C:
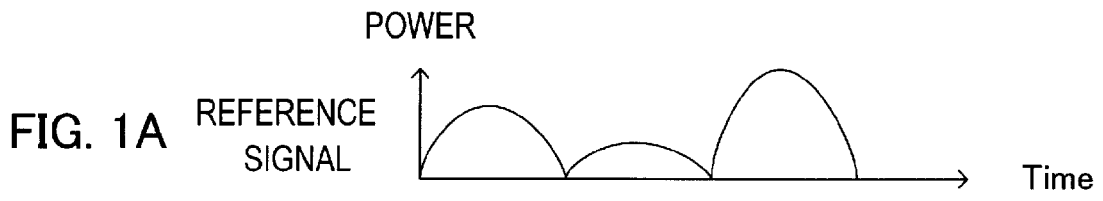
Figure 1C:
Figure 1C:
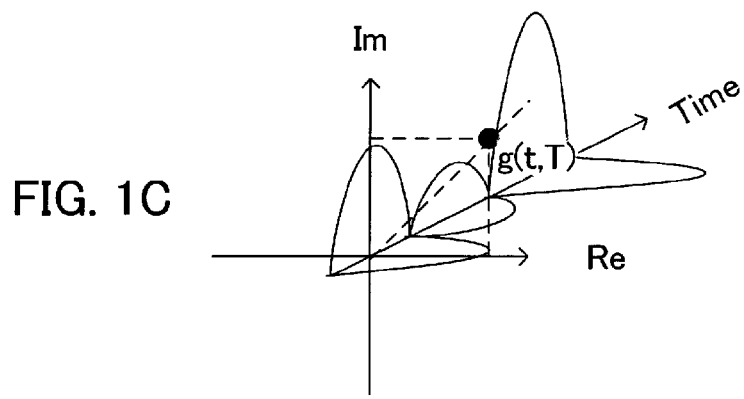

FIGS. 1A-1B are diagrams illustrating a complex number g(t, T). FIG. 1A shows the power component of a reference signal Rf(t), and FIG. 1B shows the power component of a feedback (FB) signal Fb(t+T). Also, FIG. 1C schematically shows the complex number g(t, T). In the complex number g(t, T) shown in FIG. 1C, a delay time difference ΔT between the reference signal Rf(t) and the feedback signal Fb(t+T), which is delayed from the reference signal Rf(t) by a delay time T, appears as a phase on the complex plane. Namely, when a set delay time coincides with a correct delay time T of the feedback signal Fb(t), the delay time difference ΔT becomes zero, and the power components in the real part and the imaginary part coincide, as shown in FIG. 1C. Therefore, the complex conjugate g(t, T) swings on a 45° straight line. On the other hand, when a set delay time is a time T+ΔT deviating from an actual delay time T, the amplitude of a complex conjugate g(t, T+ΔT) deviates from the 45° straight line. In the following, a difference ΔT between the set delay time and the actual feedback signal delay time T is referred to as a delay time difference.

Figure 2:
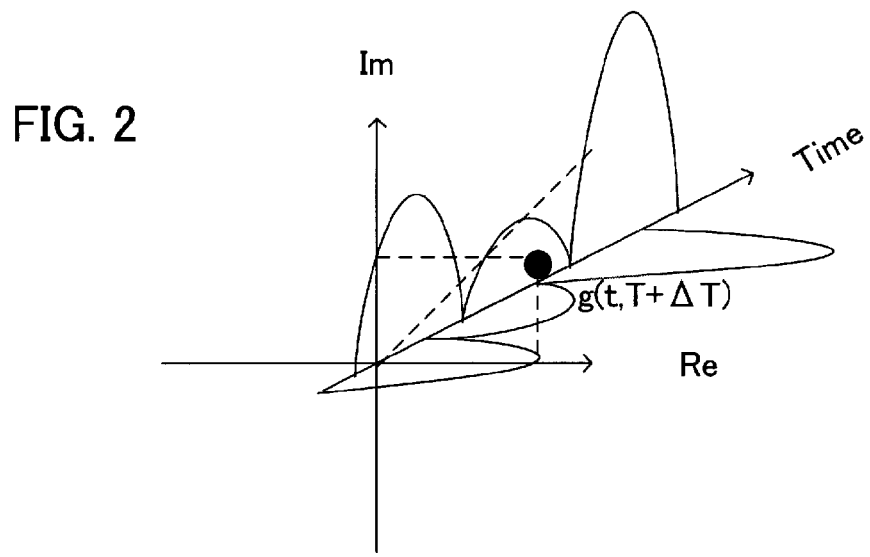
FIG. 2 is a diagram illustrating a complex number g(t, T+ΔT) having a delay time difference ΔT.

FIG. 2 is a diagram illustrating a complex number g(t, T+ΔT) having a delay time difference ΔT. There is shown a state such that the amplitude of the complex number g(t, T+ΔT) deviates from the 45° straight line, when the delay time of the feedback signal is T+ΔT, including the delay time difference ΔT.

The phase component of the complex number g (t, T) can be obtained by performing fast Fourier transform (FFT) on the complex number g(t, T). Let g(t) to be a complex number having, as an imaginary part, a feedback signal Fb(t) of which delay time is unknown, then a Fourier transform result G(ω) is expressed by formula (2).

$$G(\omega) = \sum_{t} g(t)\exp(-j2\pi\omega t) \quad (2)$$

From the Fourier transform value G(ω), the frequency components of the power component of the reference signal Rf(t), namely, the frequency components G(2F) and G(−2F), twofold the frequency F of the reference signal Rf(t), are selected. On the phases of the frequency components G(2F), G(−2F), the phase of the complex number g(t) is reflected. The phases of the frequency components G(2F), G(−2F) draw a circle according to the magnitude of the delay time difference ΔT.

Figure 3:
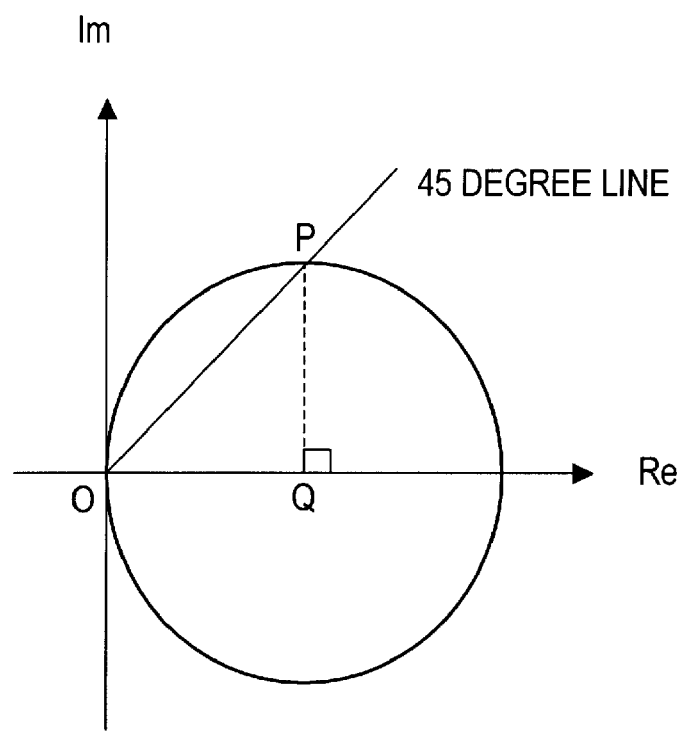
FIG. 3 is a diagram illustrating a circumference drawn by the phases of the components G(2F), G(−2F) of the fast Fourier transform value G(ω).

FIG. 3 is a diagram illustrating a circumference drawn by the phases of the components G(2F), G(−2F) of the fast Fourier transform value G (ω). When the phases of the frequency components G(2F), G(−2F) are looked on the complex plane, the phases of the frequency components G(2F), G(−2F) are represented as dots on a predetermined circumference according to the magnitude of the delay time difference ΔT. The circle has an intersection point P with a 45° straight line L, extending from the center coordinates O to an obliquely upper right direction, and is centered on a point Q at which a straight line drawn down from the above intersection point P perpendicularly to the real axis intersects with the real axis. Therefore, the circle is tangent to the center coordinates O of the complex plane, and intersects with the straight line L at the center coordinates O also. An angle (phase) φ of each point of the components G(2F) and G(−2F) on the circumference relative to a line segment PQ connecting the above point P with the circle center point Q represents the delay time difference ΔT. Here, the radius of the circle (the length of the line segment PQ or the line segment OQ) depends on the amplitude of the power component.

Figure 4A:
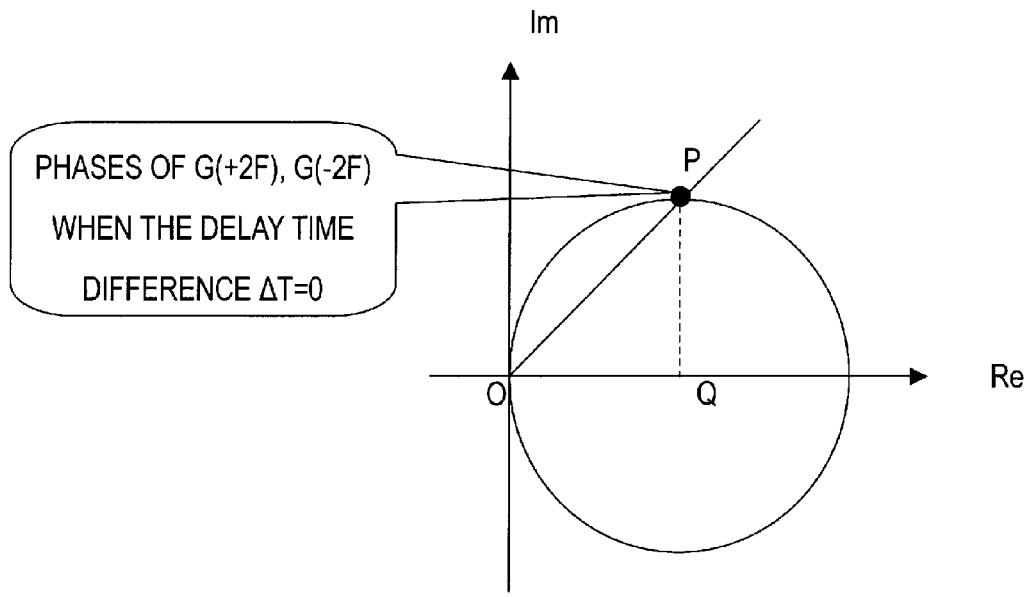
FIGS. 4A-4B are diagrams illustrating relationship between the phase and the delay time difference ΔT of the points of frequency components G(2F) and G(−2F).
Figure 4B:
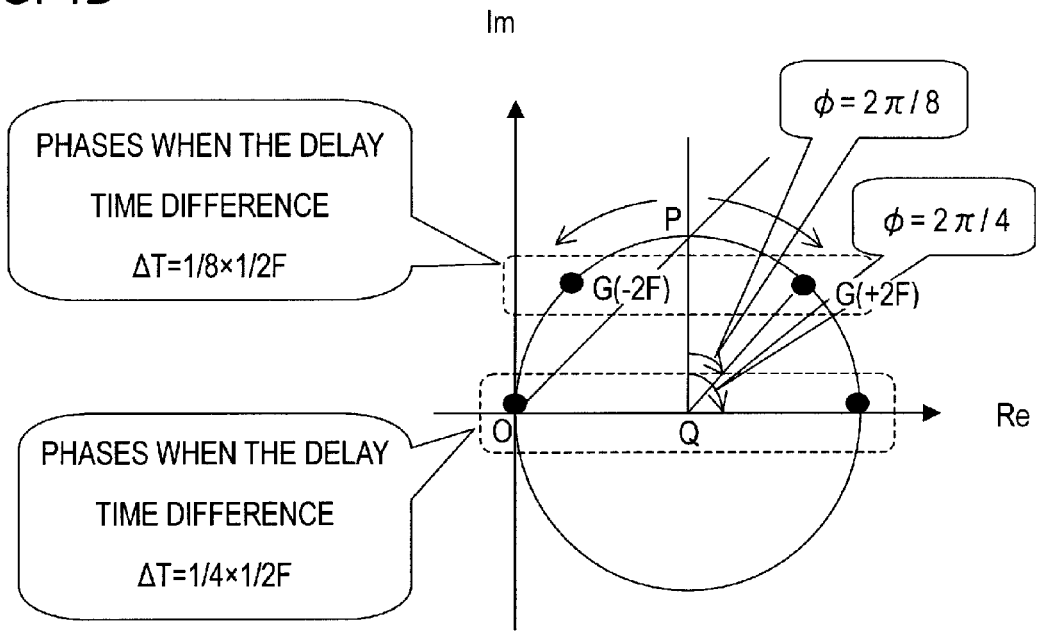

FIGS. 4A-4B are diagrams illustrating relationship between the phase and the delay time difference ΔT of the points of frequency components G(2F) and G(−2F). FIG. 4A shows the points of the frequency components G(2F) and G(−2F) on the circumference when a delay time difference ΔT=0 (i.e. no delay time difference), while FIG. 4B shows the points of frequency components G(2F) and G(−2F) on the circumference when there is a delay time difference ΔT. As shown in FIG. 4A, when the delay time difference ΔT=0, the phases of the frequency components G(2F) and G(−2F) coincide at an intersection point P, and the phases φ of the frequency components G(2F), G(−2F) are both 0°.

On the other hand, when there is a delay time difference ΔT, and the feedback signal is still delayed by the delay time difference ΔT if the reference signal is delayed by a delay time T, as the above delay time difference ΔT becomes greater, a positive frequency component G(2F) rotates clockwise on the circumference, and a negative frequency component G(−2F) rotates counterclockwise, in left-right symmetry with respect to the point P. Each rotation of the frequency components G(2F), G(−2F) makes one round when the delay time difference is a period of ½F. As shown in FIG. 4B, when the delay time difference ΔT=⅛×½F, the phase φ of the frequency components G(2F), G(−2F) becomes 2π/8, while when the delay time difference ΔT=¼×½F, the phase φ of the frequency components G(2F), G(−2F) becomes 2π/4.

To the contrary, when there is the delay time difference ΔT and the feedback signal advances by the delay time difference ΔT when the reference signal is delayed by the delay time T, as the delay time difference ΔT becomes greater, the positive frequency component G(2F) rotates counterclockwise on the circumference, and the negative frequency component G(−2F) rotates clockwise, in left-right symmetry with respect to the point P. Each rotation of the frequency components G(2F), G(−2F) makes one round when the delay time difference is a period of −½F. Therefore, according to the present embodiment, the delay time difference ΔT can be obtained within the range of the period of −½F to +½F. When the delay time difference ΔT exceeds the above range, the present processing shall be applied after being limited within the above range by another means.

The phases φ of the frequency components G(2F), G(−2F) can be obtained by the following procedure. First, the circle center point Q is moved to the center coordinates O of the complex plane, so that the real part Re[G(+2F)] of G(+2F) and the real part Re[G(−2F)] of G(−2F) are transformed into values relative to the center coordinates O of the complex plane. Typically, because the real part of the center point Q is expressed by (Re[G(+2F)]+Re[G(−2F)])/2, as in the transformation formula shown below, by subtracting the real part (Re[G(+2F)]+Re[G(−2F)])/2 of the center point Q from the real part Re[G(+2F)] of G(+2F) and the real part Re[G(−2F)] of G(−2F), respectively, it is possible to transform the real part Re[G(+2F)] of G(+2F) and the real part Re[G(−2F)] of G(−2F) to values with respect to the center coordinates O of the complex plane.

The real part $Re[G(+2F)]$ of $G(+2F) \Rightarrow$ $$Re[G(+2F)] - (Re[G(+2F)] + Re[G(-2F)])/2 =$$

$$(Re[G(+2F)] - Re[G(-2F)])/2 \ (\ldots \text{defined as "}a\text{"})$$

The real part $Re[G(-2F)]$ of $G(-2F) \Rightarrow$ $$Re[G(-2F)] - (Re[G(+2F)] + Re[G(-2F)])/2 =$$

$$(Re[G(-2F)] - Re[G(+2F)])/2$$

Additionally, the imaginary part of G(+2F) has an identical value to the imaginary part of G(−2F), and because only the real parts are slid in the above coordinate transformation, the values of the imaginary parts do not change.

Let the above coordinate-transformed real part (Re[G(+2F)]−Re[G(−2F)])/2 to be "a", and the imaginary part Im[G(+2F)] of G(+2F) to be "b", the phase φ is expressed by the following formula (3).

$$\phi = \tan^{-1}(b/a) \qquad (3)$$

It is possible to obtain the phase φ by preparing a table of the inverse tangent function $\tan^{-1}$ (b/a) beforehand, and by referring to the table. Then, using the phase φ, the delay time difference ΔT is obtained from the following formula (4).

$$\Delta T = \tfrac{1}{2} F \times \phi / 2\pi \qquad (4)$$

Because the delay time difference ΔT can be obtained quantitatively, by adjusting the presently set delay time by the delay time difference ΔT, it is possible to directly set an accurate delay time by one time of detection processing.

Figure 5A:
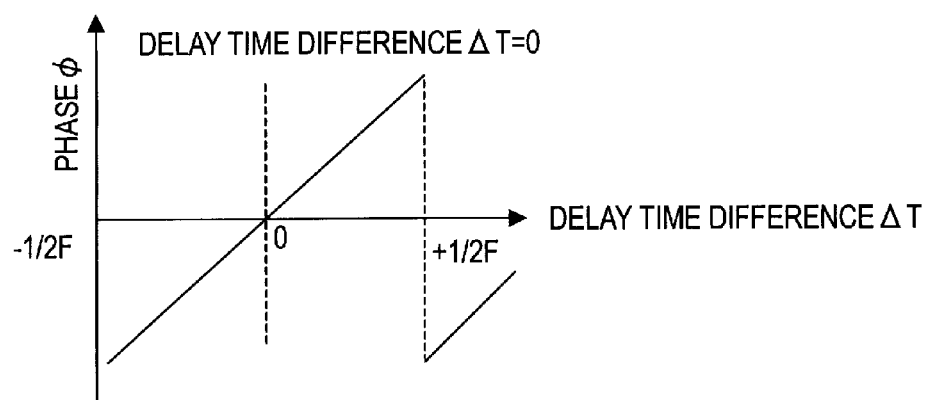
FIGS. 5A-5B are diagrams illustrating relationship between the delay time difference ΔT and the phase φ.
Figure 5B:
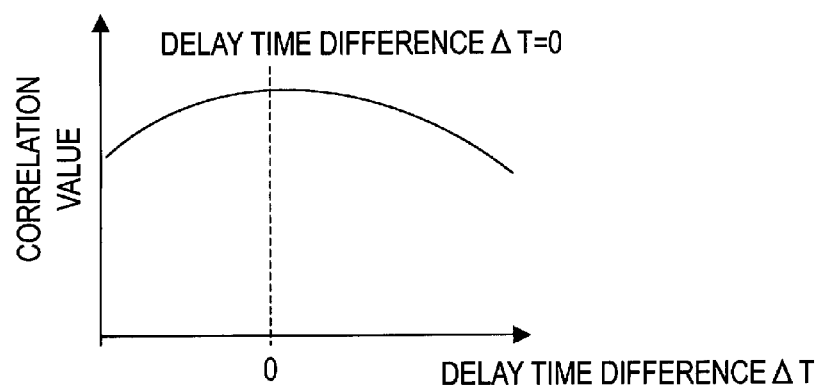

FIGS. 5A and 5B are diagrams illustrating relationship between the delay time difference ΔT and the phase φ. As shown in FIG. 5A, when the delay time difference ΔT is in the range of −½F to ½F, the delay time difference ΔT has proportional relationship of being substantially linear to the phase φ. From the phase φ, the delay time difference ΔT can be obtained with accuracy. FIG. 5B is a diagram illustrating relationship between self-correlation values and delay time differences in the second method having been explained in the prior art, as the method for obtaining the delay time difference from the self-correlation value. This diagram is used for the comparison with the present embodiment. In FIG. 5B, the self-correlation values form a gentle curve relative to the delay time differences. Because a definite peak value is not obtainable in the vicinity of the maximum value of the self-correlation values, an accurate delay time difference is not obtainable.

Additionally, when measuring the delay time difference in the state that distortion remains in the feedback signal, an error is produced in the calculation value of the phase φ because the frequency components G(2F), G(−2F) include errors. However, because of symmetry in the frequency components G(2F) and G(−2F), the error when the delay time difference ΔT is nearly zero is negligibly small. However, when the distortion of the feedback signal is relatively large because of no correction, and when it is decided that an error is included in the calculation value of the phase φ, it may be possible to adopt an algorithm of making the delay time difference ΔT asymptotic to zero by measuring the delay time difference ΔT for a plurality of number of times.

Also, when the phase φ is sufficiently small, it is possible to approximate the phase using a tangent (tan) function (φ≈tan φ). By this, the table of the inverse tangent function $\tan^{-1}$ (b/a) becomes unnecessary, which makes it possible to reduce a circuit scale and simplify processing.

FIG. 6 is a diagram illustrating an error of the phase φ when the approximation of φ≈ tan φ is made. In FIG. 6, each "step" represents a unit of delay adjustment when delay adjustment is made on the basis of τ/128, and errors in first 16 steps out of 128 steps are shown in FIG. 6. Each "φ median value" represents φ corresponding to each unit of delay adjustment shown in the step of the left column. A "φ upper-limit threshold" is a threshold to be referred to in order to obtain the number of necessary error adjustment steps for the obtained φ. When tan φ exceeds the upper-limit threshold, the next step is applied. The φ upper-limit threshold for a step n (n is an integer) is an intermediate value between the φ median value of the step n and the φ median value of the step (n+1). "Tan φ" shows a value when the φ median value is represented by tan. Also, "error" represents an error rate between the median value φ and tan φ.

For example, assuming that φ is 0.44179, the number of delay adjustment steps actually needed is 9. When φ is approximated using tan φ, 0.47496 is obtained, which exceeds the φ upper-limit threshold of 0.46633 in step 9. Accordingly, the number of delay adjustment steps is decided to be 10, producing an error in the delay time difference ΔT.

Additionally, in the above description, an example of using the power components of the reference signal Rf(t) and the feedback signal Fb(t) has been explained. However, a similar effect may be obtained if an envelope value (square root of the power component) is used, in place of the power component.

The envelope value is a parameter virtually related to the power component. Now, subsequently, the configuration of a distortion compensation apparatus executing processing for detecting the above-mentioned delay time difference ΔT will be described.

Figure 7:
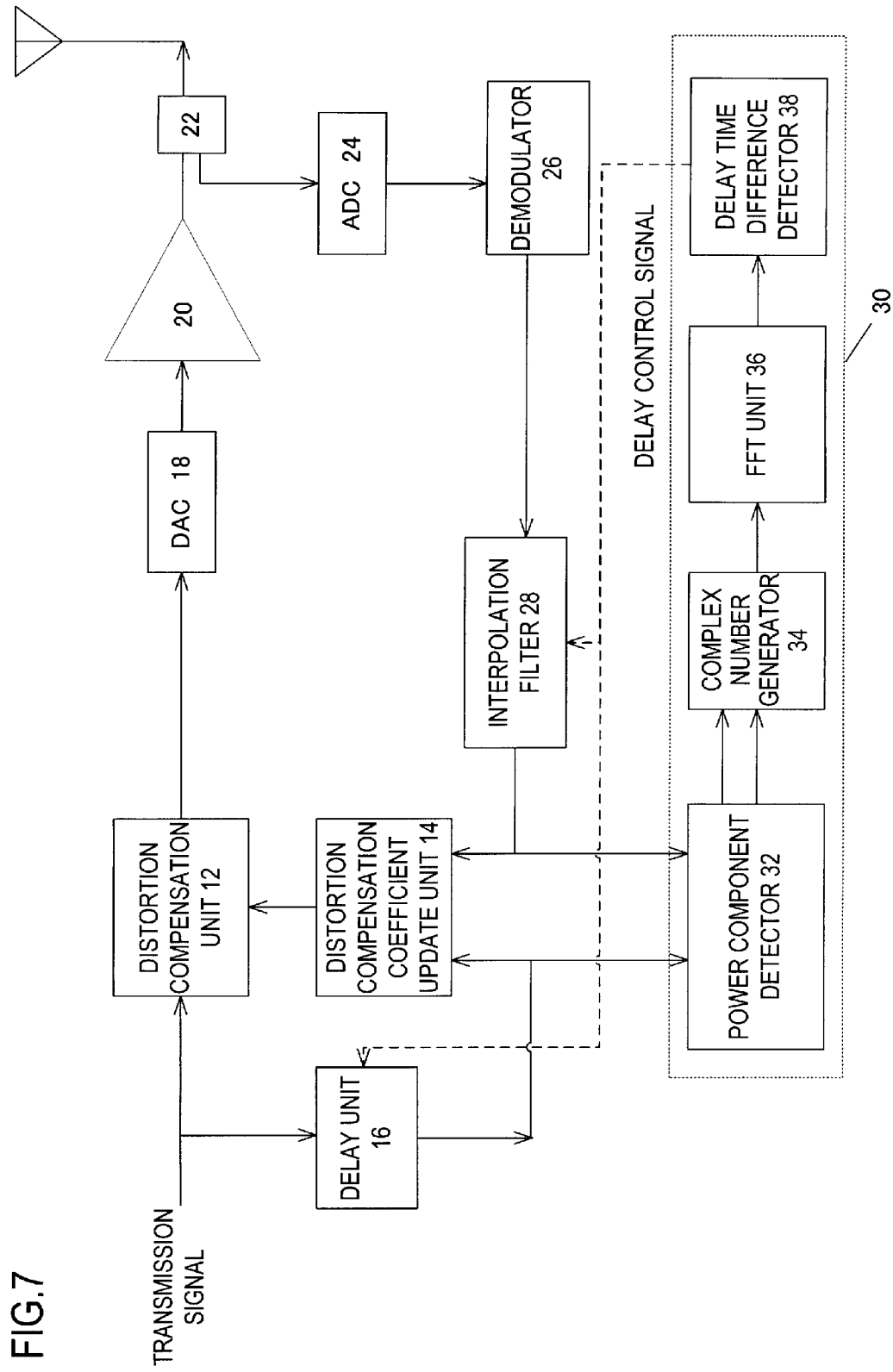
FIG. 7 is a diagram illustrating an exemplary configuration of the distortion compensation apparatus according to the present embodiment.

FIG. 7 is a diagram illustrating an exemplary configuration of the distortion compensation apparatus according to the present embodiment. A distortion compensation unit 12 multiplies a transmission signal by a distortion compensation coefficient being output from a distortion compensation coefficient update unit 14. Distortion compensation coefficient update unit 14 stores a distortion compensation coefficient table according to transmission signal power. By means of adaptive signal processing using an LMS (least mean square) algorithm, distortion compensation coefficient update unit 14 calculates and updates the distortion compensation coefficient so as to obtain zero difference between the transmission signal and the feedback signal. Distortion compensation coefficient update unit 14 then outputs to distortion compensation unit 12 the distortion compensation coefficient according to the transmission signal power to be input after a delay is made by a delay unit 16. Delay unit 16 is configured of a delay FIFO buffer, for example, which delays the input transmission signal on a clock-by-clock basis by the amount of the set delay time, and outputs the transmission signal.

A D/A converter (DAC) 18 converts the digital transmission signal output from distortion compensation unit 12 to an analog signal. A power amplifier 20 amplifies the transmission signal. The transmission signal which is output from power amplifier 20 is radio output from an antenna. A directional coupler 22 extracts a portion of transmission signal output from power amplifier 20, and generates a feedback signal. The analog feedback signal is converted into a digital signal by means of an A/D converter (ADC) 24, and after demodulation processed by a demodulator 26, the above signal is input to an interpolation filter 28. Interpolation filter 28 is an LPF (low pass filter) having a function of fine-tuning the feedback signal delay, and is configured of an FIR (finite impulse response) filter, as an example. Interpolation filter 28 adjusts a time smaller than a unit of clock to the feedback signal delay time. By means of both delay unit 16 for adjusting the delay time on a clock-by-clock basis and interpolation filter 28 for adjusting a time smaller than the unit of clock, the feedback signal delay time is adjusted with high accuracy.

A delay control unit 30 executes the aforementioned processing for detecting the delay time difference according to the present embodiment. Delay control unit 30 includes power component detector 32, complex number generator 34, FFT unit 36 and delay time difference detector 38.

FIG. 8 is a processing flowchart of delay control unit 30. Power component detector 32 detects each power component of the transmission signal Rf(t) and the feedback signal Fb(t+T) (S100, S102). Complex number generator 34 generates a complex number g(t, T) having, as a real part, the power component of the transmission signal (reference signal) Rf(t) before distortion compensation, and as an imaginary part, the power component of the feedback signal Fb(t+T) in case of a delay time T (S104). FFT unit 36 performs fast Fourier transform (FFT) of the complex number g(t, T), so as to obtain a Fourier transform value G(ω) (S106).

Delay time difference detector 38 obtains frequency components G(2F), G(−2F) out of the Fourier transform results G(ω) (S108), and by using the frequency components G(2F), G(−2F), detects a delay time difference ΔT from the aforementioned formulae (3), (4) (S110). Based on the detected delay time difference ΔT, delay time difference detector 38 outputs a delay control signal to control the delay time to be set to delay unit 16 and interpolation filter 28, and adjusts the presently set delay time (T+ΔT) to a correct delay time T of the feedback signal (S112).

As having been described, according to the present embodiment, by means of one-time delay time detection processing, a delay time to be set can be directly adjusted to a correct delay time T, making it unnecessary to repeat calculation processing for converging to a correct delay time. Thus, an accurate delay time can be set within a short time. As compared to the conventional case of adjusting a delay time based on a self-correlation value, a time reduction on the order of 1,000 times or more can be achieved. Also, to the variation of the feedback signal delay time, it is possible to trace instantly without a time lag. Further, the calculation processing load can be reduced.

Also, it is sufficient to perform the fast Fourier transform processing for obtaining only the frequency components (±2F), twofold the transmission signal frequency. This makes it unnecessary to provide an FFT buffer, and a circuit scale can be reduced accordingly.

By approximating phase obtained from the Fourier transform value of a complex number by a tangent function (tan), it is possible to make the table of an inverse tangent function unnecessary.

The distortion compensation apparatus according to the present embodiment may preferably be applied to a base station apparatus or a mobile terminal in a mobile communication system, such as a WiMAX (Worldwide Interoperability for Microwave Access) system and an LTE (Long Term Evolution) system.

The distortion compensation apparatus according to the present disclosure can obtain an accurate feedback signal delay time at high speed, enabling accurate adjustment of the timing between the transmission signal and the feedback signal. By this, the accuracy of the distortion compensation coefficient is improved, and a stable distortion compensation operation can be achieved.

All examples and conditional language recited herein are intended for pedagogical purposes to aid the reader in understanding the invent ion and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has been described in detail, it should be understood that the various changes, substitutions, and alterations could be made hereto without departing from the spirit and scope of the invention.

What is claimed is:

1. A distortion compensation apparatus for compensating a distortion characteristic of an amplifier amplifying signals, comprising:
   a distortion compensation coefficient update unit configured to store a distortion compensation coefficient to compensate the distortion characteristic of the amplifier, configured to calculate the distortion compensation coefficient to compensate the distortion character of the amplifier based on a signal before input to the amplifier and a feedback signal of a signal output from the amplifier, and configured to update the stored distortion compensation coefficient to the calculated distortion compensation coefficient;

a distortion compensation unit configured to perform distortion compensation processing of the signal before input to the amplifier by using the updated distortion compensation coefficient;

a delay unit into which the signal before input to the amplifier is input, configured to delay the signal by a set delay time, to output the delayed signal to the distortion compensation coefficient update unit; and a delay controller configured to control the set delay time to be set in the delay unit based on a phase of a complex number having a power component of the signal before input to the amplifier as a real part, and a power component of the feedback signal as an imaginary part.

2. The distortion compensation apparatus according to claim 1, wherein the delay controller obtains the phase of the complex number by executing fast Fourier transform of the complex number, and based on the phase of the complex number, detects a delay time difference between the set delay time set in the delay unit and an actual delay time of the feedback signal, and adjusts the delay time set in the delay unit by an amount equal to the delay time difference.

3. The distortion compensation apparatus according to claim 1, wherein the delay controller executes fast Fourier transform of the complex number, and detects a delay time difference between the set delay time set in the delay unit and an actual delay time of the feedback signal based on the phase of twofold frequency component of the signal before input to the amplifier in a fast Fourier transform value, and adjusts the set delay time set in the delay unit by an amount equal to the delay time difference.

4. The distortion compensation apparatus according to claim 3, wherein the delay controller detects the delay time difference based on an inverse tangent function of the phase of the twofold frequency component.

5. The distortion compensation apparatus according to claim 3, wherein the delay controller detects the delay time difference based on a tangent function of the phase of the twofold frequency component.

6. A distortion compensation method for compensating a distortion characteristic of an amplifier amplifying signals, comprising:

storing a distortion compensation coefficient to compensate the distortion characteristic of the amplifier;

calculating the distortion compensation coefficient to compensate the distortion character of the amplifier based on a signal before input to the amplifier and a feedback signal of a signal output from the amplifier;

updating the stored distortion compensation coefficient to the calculated distortion compensation coefficient;

performing distortion compensation processing of the signal before input to the amplifier by using the updated distortion compensation coefficient;

delaying the signal before input to the amplifier by a set delay time, to output the delayed signal; and controlling the set delay time to be set in the delay unit based on a phase of a complex number having a power component of the signal before input to the amplifier as a real part, and a power component of the feedback signal as an imaginary part.

* * * * *